US 9,130,682 B2

(12) United States Patent
Bach

(10) Patent No.: US 9,130,682 B2
(45) Date of Patent: Sep. 8, 2015

(54) CIRCUIT FOR SETTING THE VOLTAGE POTENTIAL AT THE OUTPUT OF A PIN PHOTORECEIVER AND PHOTORECEIVER ASSEMBLY

(75) Inventor: Heinz-Gunter Bach, Berlin (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 538 days.

(21) Appl. No.: 13/511,339

(22) PCT Filed: Nov. 24, 2010

(86) PCT No.: PCT/EP2010/007281
§ 371 (c)(1),
(2), (4) Date: Aug. 8, 2012

(87) PCT Pub. No.: WO2011/063991
PCT Pub. Date: Mar. 6, 2011

(65) Prior Publication Data
US 2012/0305753 A1     Dec. 6, 2012

(30) Foreign Application Priority Data
Nov. 25, 2009   (DE) .................. 10 2009 056 059

(51) Int. Cl.
*H04B 10/69*   (2013.01)
*H01L 31/02*   (2006.01)
*H03F 3/08*   (2006.01)
*G01J 1/44*   (2006.01)

(52) U.S. Cl.
CPC ............... *H04B 10/6911* (2013.01); *G01J 1/44* (2013.01); *H01L 31/02* (2013.01); *H03F 3/08* (2013.01); *H04B 10/69* (2013.01); *G01J 2001/446* (2013.01); *G01J 2001/4446* (2013.01)

(58) Field of Classification Search
CPC ........... H04B 10/6911; H03F 3/08; G01J 1/44
USPC ............ 250/214 A, 214 AG, 214 C, 214 DC, 250/214 LA, 214 R, 239; 327/100, 101, 102, 327/103, 104, 127, 137; 330/4.6, 97, 330/252–254, 259–261
See application file for complete search history.

(56) References Cited

U.S. PATENT DOCUMENTS 7,221,229 B2 *   5/2007   Schrodinger ................. 330/308
2009/0238582 A1   9/2009   Tsunoda et al.

OTHER PUBLICATIONS

Bach et al., Design and Fabrication of 60-Gb/s InP-Based Monolithic Photoreceiver OEICs and Modules, IEEE Journal of Selected Topics in Quantum Electronics, vol. 8, No. 6, Nov. 1, 2002, 6 pgs.

* cited by examiner

*Primary Examiner* — Georgia Y Epps
*Assistant Examiner* — Don Williams
(74) *Attorney, Agent, or Firm* — Faegre Baker Daniels LLP

(57) ABSTRACT

A circuit sets an output potential at a radio frequency (RF) output of a pin photoreceiver that includes an ohmic terminal resistor connected between a supply voltage and the RF output. The circuit includes a control loop with an ohmic replication resistor having a resistance approximately equal to a resistance of the ohmic terminal resistor. The control loop further includes a sub-circuit configured to measure a voltage difference across the ohmic replication resistor and to reproduce the voltage difference as the supply voltage at an output terminal of the control loop.

16 Claims, 5 Drawing Sheets

CIRCUIT FOR SETTING THE VOLTAGE POTENTIAL AT THE OUTPUT OF A PIN PHOTORECEIVER AND PHOTORECEIVER ASSEMBLY

CROSS-REFERENCE TO RELATED APPLICATION(S)

This application claims priority to PCT Application Ser. No. PCT/EP2010/007281, filed Nov. 24, 2010, which claims priority to DE 10 2009 056 059.9, filed Nov. 25, 2009, each of which is herein incorporated by reference in its entirety.

FIELD OF THE INVENTION

The invention relates to a circuit arrangement for setting the voltage potential at the radio frequency (RF) output of a pin photoreceiver and to a photoreceiver arrangement.

BACKGROUND

Ultrasound photoreceivers which function in the serial 100 Gbit/s data rate range and are designed for d.c. voltage coupling to subsequent electronic circuits, e.g. to a demultiplexer circuit, in the simplest case consist of a pin photodiode with a rear-side bias feed, but also of a pin photodiode, integrated with a travelling wave amplifier TWA. The photoreceivers are usually designed as optoelectronic, integrated circuits (OEIC) which are connected to a further integrated circuit, e.g. to the demultiplexer which is mentioned above. However, subsequent electronics may also be a sampling circuit of a sampling oscilloscope or a travelling wave amplifier or likewise. A demultiplexer is hereinafter selected as subsequent electronics for explanation.

The photoreceiver converts an optical data flow which is coupled via a glass fiber into the photodiode of the OEIC, into an electrical output signal of the same data rate, which as a high-frequency output signal is transferred further to the subsequently connected demultiplexer. This demultiplexes, for example here the 100 Gbit/s electrical data signal, into two 50 Gbit/s data signals which appear at its two outputs.

If the photoreceiver is designed as a pinTWA photoreceiver according to FIG. 1, the travelling wave amplifier on the chip is integrated with the photodiode PD and its wiring to a bias resistance $R_{bias}$ and a blocking capacitance $C_{bias}$, so that the photodiode signal is already amplified on the chip. The travelling wave amplifier comprises a plurality of transistors which are connected in parallel, FETS in the present case, but also bipolar transistors are possible, whose gate and drain terminals are each connected via micro-strip conductors to coplanar waveguide elements CPW. One end of the chain of coplanar waveguide elements CPW which is connected to the gate connections of the transistors via the microstrip conductor elements MSL, is connected to the photodiode PD, and the other end is connected via a terminal resistance $R_{gt}$ to the negative operating voltage $-V_{ss}$ or via a blocking capacitance $C_{gt}$ to ground or earth also with regard to RF technology. A further chain of waveguide elements CPW which is connected to the drain connections of the FETs T, on the one hand is connected to the integrated drain terminal resistance $R_{dt}$ and via a chip-external bond wire inductance $L_{dt}$ to a positive voltage supply connection $+V_{dt}$, and on the other hand to the signal output, to which a demultiplexer is connected for example. The pinTWA chip is supplied with voltage/current at the positive terminal $+V_{dt}$ and at a negative terminal $V_{ss}$ (negative bias). A d.c. voltage potential $V_a$ is present at the output of the photoreceiver, apart from the high-frequency output signal or input signal for the demultiplexer, and is likewise present at the electric input of the demultiplexer. The demultiplexer in many cases has the best switching behavior if the average d.c. input voltage lies around 0 V, wherein its maximal voltage swing is to lie in a safe working range of −0.6 V to +0.4 V.

According to the state of the art, the demultiplexer circuits at their output are extremely sensitive to overvoltages, since with the high switching frequencies, the sensitive input transistors may hardly be provided with protective circuits against voltage peaks which would immediately reduce the limiting frequency. Accordingly, the user who connects a photoreceiver OEIC in series in front of the demultiplexer IC must ensure that such voltage peaks and also possible DC-offsets remain within the mentioned windows, otherwise one must reckon with a defect of the demultiplexer. The photoreceiver, in particular the pinTWA photoreceiver and the demultiplexer ICs in the high Gbit/range are currently very expensive circuits.

The output of the photoreceiver which in the case of a pinTWA photoreceiver may also be present in cascode circuitry, must therefore be connected to the input of the demultiplexer IC. With the pinTWA photoreceiver, whose potential of the high-frequency electric output may be set to around 0 V via a suitable setting of the two supply voltages $+V_{dt}$ and $-V_{ss}$, in practical operation, it is a question of being able to measure the voltage potential at the output of the photoreceiver, or at the input of the demultiplexer, in order to keep the supply voltages of the pinTWA photoreceiver always within the voltage margins of a secure operating range of the demultiplexer, also in the dynamic case of switching on and off as well as in operation, so as to avoid the possible destruction of the demultiplexer.

In the case of a simple photoreceiver in the form of a photodiode chip, although one or more bias terminals are provided, which permit the application of a bias voltage to the diode, in this simplified embodiment however, with a d.c. coupling of the signal-RF-output of the diode to the multiplexer circuit, the average photocurrent from the diode would lead to a shifting of the operating point of the demultiplexer, as a rule in the positive direction, by which means one departs from the optimal operating region of the demultiplexer.

With regard to the pinTWA photoreceiver, a concerted manual run-up of the two supply voltages $V_{dt}$ and $-V_{ss}$ would have to be effected under the condition that the RF output of the photoreceiver is constantly kept around 0 V, in order to avoid the mentioned disadvantages. In order to rule out all risks of transient overvoltage impulses and also to be able to measure the output potential of the photoreceiver, the intermediate connection of a so-called bias-T into the connection line between the photoreceiver and the demultiplexer has established itself and this comprises a capacitance lying in the signal line, and a resistance or an inductance, which lead to a setting terminal. Such an application of a bias-T is also known with a pure pin-photoreceiver. These bias-Ts must be suitable for limiting frequencies in the 100 GHz region and also for lower limiting frequencies down to at least 100 KHz, in order with this to transmit the signal bandwidth as well as the so-called frame clock which may reach down to the 10 KHz range. They are thereby likewise very inexpensive and moreover they damp the high-frequency output signal of the photoreceiver by about 2 dB and thus negate a part of its amplification (10 dB).

If in prior stages of development, both components—the photoreceiver and demultiplexer are present in separate housings, then the intermediate connection of a bias-T is easily possible, even if having the previously mentioned disadvantages. In advanced housing scenarios, in the so-called co-packaging, however both components, the photoreceiver and demultiplexer are incorporated into a single housing, in order on the one hand to save housing costs and on the other hand to also reduce the signal damping between both integrated circuits, which otherwise additionally result by way of the necessary RF connection plug and leads which lie at approx. 2 dB per housing. Moreover, in this preferred co-packaging design, only medium-frequency signals leave the housing, so that connection costs for highest frequency plugs are saved. If this preferred co-packaging case is present, then both integrated circuits are packaged together in an as compact as possible manner in a housing and directly connected with ultra-short bond wires, so that then however one may no longer introduce any more bias-Ts. With this, the operationally accompanying possibility of measuring the output d.c. voltage $V_a$ of the photo receiver or the input voltage of the demultiplexer is then negated.

SUMMARY OF THE INVENTION

In one aspect, a circuit sets an output potential at a radio frequency (RF) output of a pin photoreceiver that includes an ohmic terminal resistor connected between a supply voltage and the RF output. The circuit includes a control loop with an ohmic replication resistor having a resistance approximately equal to a resistance of the ohmic terminal resistor. The control loop further includes a sub-circuit configured to measure a voltage difference across the ohmic replication resistor and to reproduce the voltage difference as the supply voltage at an output terminal of the control loop.

In another aspect, a photoreceiver assembly includes a pin photoreceiver including at least one photodiode and having a radio frequency (RF) output and an ohmic terminal resistor connected between a supply voltage and the RF output. The photoreceiver assembly further includes a circuit including a control loop with an ohmic replication resistor having a resistance approximately equal to a resistance of the ohmic terminal resistor. The control loop further includes a sub-circuit configured to measure a voltage difference across the ohmic replication resistor and to reproduce the voltage difference as the supply voltage at an output terminal of the control loop While multiple embodiments are disclosed, still other embodiments of the present invention will become apparent to those skilled in the art from the following detailed description, which shows and describes illustrative embodiments of the invention. Accordingly, the drawings and detailed description are to be regarded as illustrative in nature and not restrictive.

DETAILED DESCRIPTION

Figure 1:
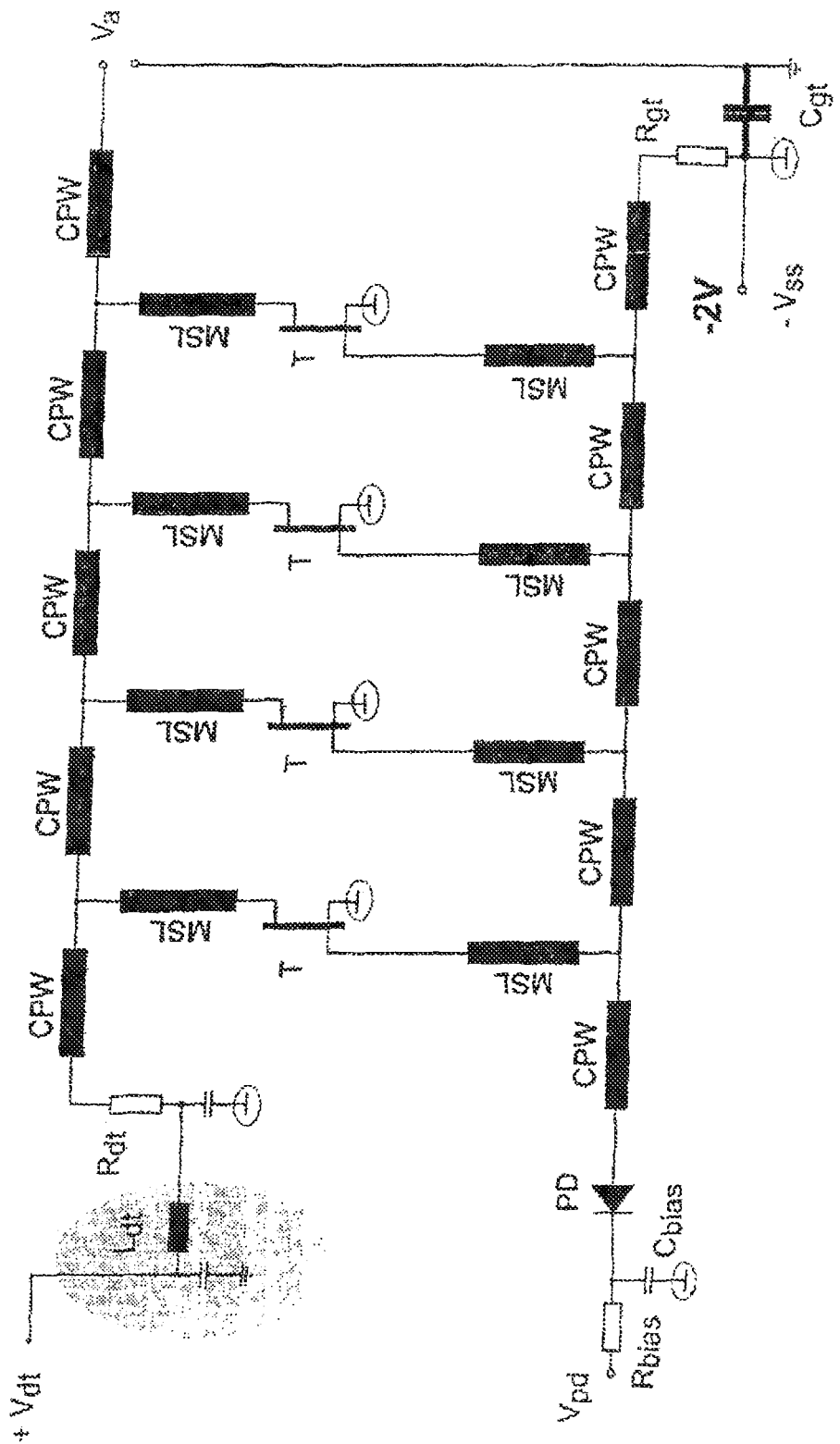
FIG. 1 is a schematic view of a circuit design of a pinTWA photoreceiver according to the state of the art.
Figure 2:
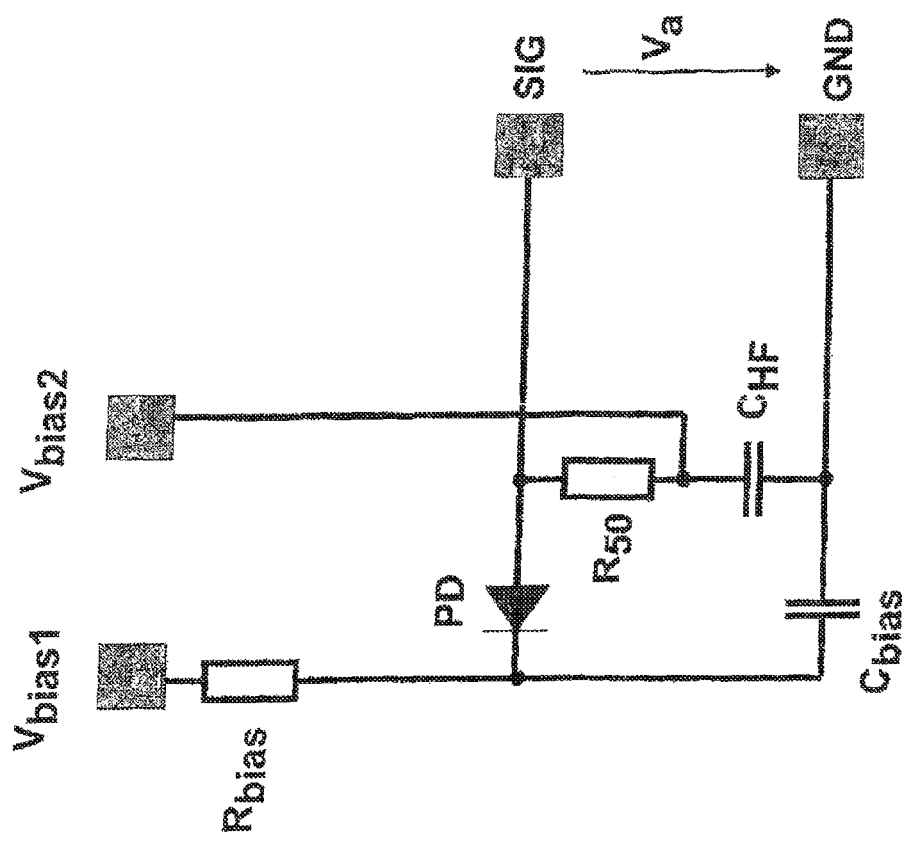
FIG. 2 is a schematic circuit diagram of a photo-receiver with only one pin-photodiode and two bias connections.
Figure 3:
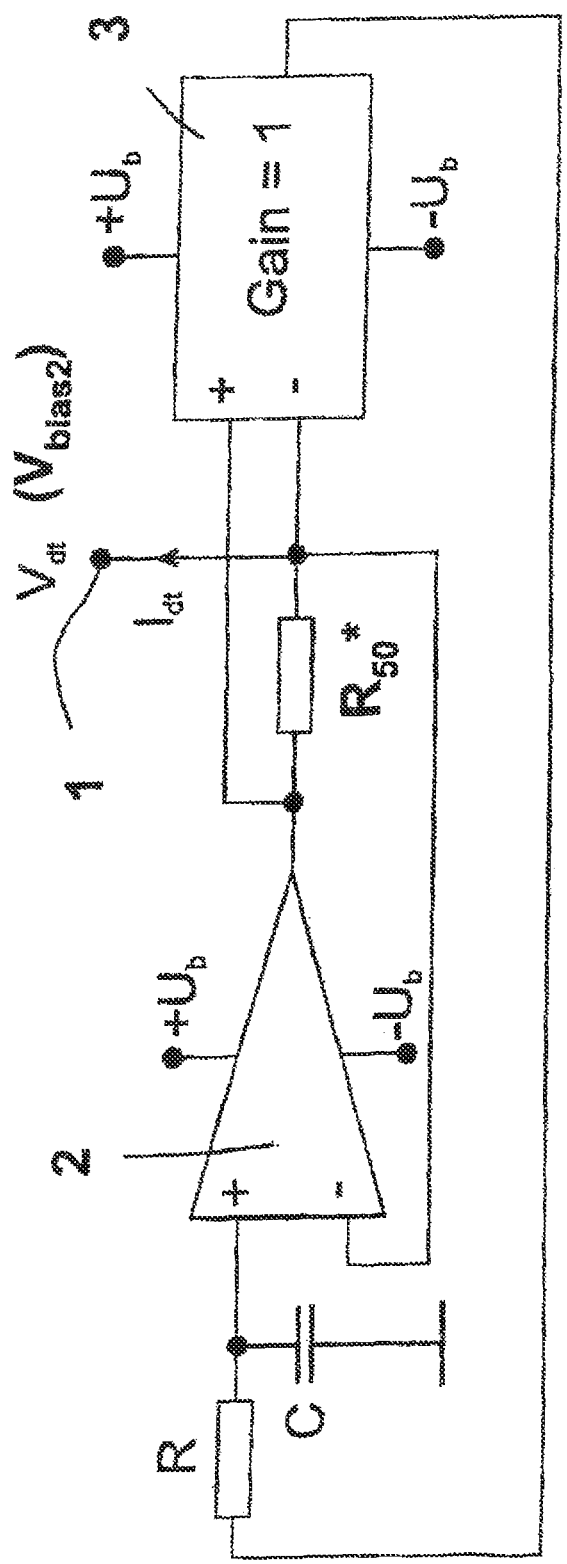
FIG. 3 is a schematic view of a circuit design of the closed-loop control (regulating) circuit according to a first embodiment.

A circuit design of the circuit arrangement according to the invention, for setting or closed-loop controlling the voltage potential at the RF output of a pin photoreceiver which may be a pin photodiode receiver chip according to FIG. 2, but also a pinTWA photoreceiver 1, is represented in FIG. 3. In the case of a pinTWA photoreceiver, i.e. of a photodiode circuit which with a travelling wave amplifier is integrated on a chip, wherein the travelling wave amplifier may also be provided in a cascode circuit, the circuit arrangement according to FIG. 3 serves as a positive voltage supply of the pinTWA photoreceiver at its input connection terminal $V_{dt}$. This positive voltage supply should be automatically controlled with a closed loop by way of the circuit according to the invention, on booting and shutting down, wherein the negative voltage supply of the photoreceiver at the negative connection terminal $V_{ss}$ is set by the operator in a slow-changing manner, beginning from 0.

The regulating circuit comprises an output terminal 1 which is either to be connected to the connection for the positive operating voltage of the pinTWA photoreceiver $V_{dt}$ or in the case of a pin diode chip photoreceiver is to be connected to the second bias terminal $V_{bias2}$. The regulating circuit moreover comprises an operational amplifier 2 as a unity-gain amplifier and a differential amplifier 3 which are arranged in a closed control loop. Moreover, a replication resistance $R_{50}^*$ is connected in this control loop and on the one hand is connected to the output terminal 1 of the regulating circuit and on the other hand to the output of the operational amplifier 2. The two sides of the replication resistance $R_{50}^*$ for the measurement of the voltage drop across this resistance are led to the positive and negative inputs of the differential amplifier 3, and the output of the differential amplifier 3 which has an amplification of 1, is led via an RC-element which represents a low-pass, to the positive input of the operational amplifier 2. The negative input of the operational amplifier connected as a unity-gain amplifier is connected to the output terminal 1.

For a precise function of the closed-loop control, usually with the aim of an output voltage potential which lies at 0V, it is essential that the resistance $R_{50}^*$ is matched to the terminal resistance $R_{50}$ according to FIG. 2 which is integrated in the photoreceiver. In the case of a pinTWA photoreceiver, the terminal resistance $R_{50}$ is the drain wire terminal resistance $R_{dt}$ which is assumed as being known, since it may be measured in the chip pre-characterisation and is usually in the order of 50 Ohms. With the purely pin-photodiode receiver according to FIG. 2, the terminal resistance $R_{50}$ may be recognized at the output of the photoreceiver. Due to circuiting, thus with the same current flowing through, which is indicated here at $I_{dt}$, the voltage drop over $R_{50}$ or $R_{dt}$ (only $R_{50}$ is cited in the following text) in the photoreceiver is identical to the voltage drop across the replication resistance $R_{50}^*$, since the extremely high-ohmic inputs of the instrument amplifiers (differential amplifiers) may be regarded as being practically without current, according to the following equation $$U(R_{50}^*)=I_{dt}\times R_{50}^*=U(R_{50})=I_{dt}\times R_{50}$$

Thus a control or closed-loop control of the operating voltage $V_{dt}$ at the voltage supply terminal of the pinTWA photoreceiver or of the bias voltage $V_{bias2}$ (as shown in brackets in FIG. 3) at the second bias terminal of the pure pin diode receiver to the value of $U(R_{50}^*)=U(R_{50})$ at the RF output of the photoreceiver would lead to exactly 0, by which means the input potential of the subsequent electronics, i.e. of the demultiplexer, is likewise closed-loop controlled to 0V. The circuit according to FIG. 3 obtains the voltage drop $U(R_{50})=U(R_{50}^*)$ via the voltage difference measurement at the replication resistance $R_{50}^*$ with the help of the differential amplifier 3 with the amplification factor 1. Its output signal, via the closed control loop is given to the input of the unity-gain operational amplifier 2 which by way of its own negative feedback reproduces the potential of the exit signal exactly at its minus input, and this being irrespective of the magnitude of the voltage drop $U(R_{50}^*)$. This potential or the voltage also lies at the output terminal 1 of the regulating circuit and thus as a positive operational voltage feeds the pinTWA photoreceiver or forms the bias voltage of the second bias terminal of the pin diode receiver.

The operational amplifier 2 is thus switched such that with a pinTWA receiver and a $V_{ss}$-potential increasing slowly into the negative region, independently of the magnitude of the drain current $I_{dt}$ of the travelling wave amplifier, it always increases the voltage potential at the output terminal 1 of the regulating circuit in an exact manner, to such an extent that the RF output of the travelling wave amplifier is controlled with a closed loop to $V_a=0$ V, over the equally high voltage drop at the drain terminal resistance $R_{dt}$.

In a corresponding manner, with a photoreceiver according to FIG. 2, by way of internal measurement of the photocurrent and adaptation of the bias voltage $V_{bias2}$, one closed-loop controls always to a constant potential at the RF output SIG of 0 V, irrespective of the magnitude of the photocurrent.

The RC low-pass element at the positive input of the operational amplifier 2 has the effect that the control behavior of d.c. voltage which is set by the circuit arrangement according to FIG. 3 is only maintained up to a limit frequency $f_u$, above which the operational frequency range of the photoreceiver then begins, therefore $f_u$ typically lies in a region of a few KHz. This KHz limit may then be easily adapted to the requirements of the operational transmission frequency region of the photoreceiver.

In the case of a pinTWA photoreceiver, the user may thus concentrate on the booting and shutting-down of a single operating voltage, here the negative operating voltage $-V_{ss}$ which is typically between $-2$ V and $0$ V, wherein the regulating circuit according to FIG. 3 for practically any settable negative voltage values of $-V_{ss}$ always produces the positive voltage $V_{dt}$ which matches with this and which always sets the RF output or the demultiplexer input to a.c. voltage $V_a=0$ V.

This favorable control behavior at the RF output is completely independent on the non-linearity of the output characteristics lines of the transistors used in the travelling wave amplifier, since one controls with a closed loop exclusively on account of the operating current $I_{dt}$ which is continuously measured by the regulating circuit. The RF output for infinitely varying photocurrents in the mV region is thus held exactly at 0 V, where its usually most favorable switching wave lies.

Of course FIG. 3 merely shows a principle circuit and with the realisation, various circuit elements are added, which ensure that the operational amplifier 2 may operated in an oscillation-free and ESD-protected manner, in accordance with the differential amplifier 3.

The operating voltage supplies $+U_b$ and $-U_b$ of the operational amplifier $2a$ and of the differential amplifier 3 which is usually likewise constructed with operational amplifiers, may be tapped favorably only from a single voltage, wherein symmetrical operating voltages may be tapped from a mains part by way of known voltage bisectional circuits. This desired operating voltage symmetry is maintained even on varying the voltage of the common voltage source, in particular with its switching-on and switching-off, i.e. both voltages $+U_b$ and $-U_b$, usually $\pm 12$V may then be booted (run up) and shut down in an exactly synchronous manner. Thus no voltage deviations at the RF output occur during the switch-on and switch-off sequences.

Figure 4:
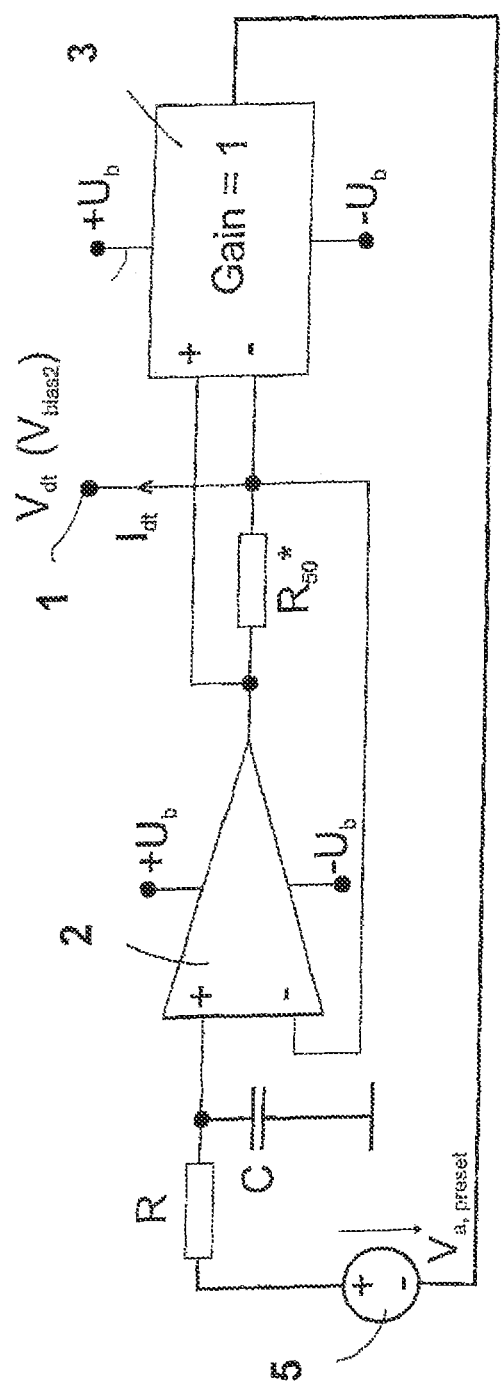
FIG. 4 is a schematic view of a circuit design of the regulating circuit according to a second embodiment.
Figure 5:
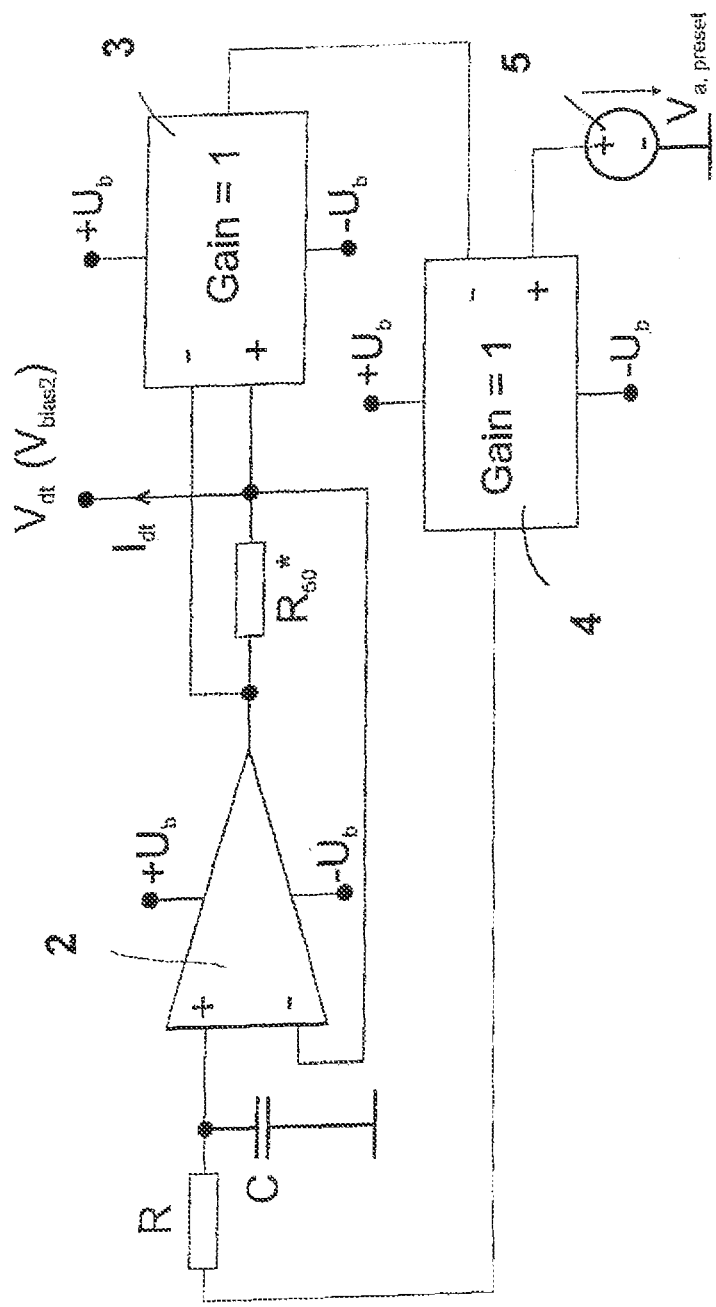
FIG. 5 is a schematic view of a circuit design of the regulating circuit according to a third embodiment in which a voltage source for $V_{a,\ preset}$ is earthed.

A further design of the regulating circuit according to FIG. 3 is represented in FIG. 4 and FIG. 5 and serves for setting the output d.c. voltage $V_a$ not to $V_a=0$ V, but to a defined value which is indicated with $V_a=V_{a,\ preset}$ and which may for example lie between $\pm 100$ mV. For this a voltage source 5 is connected into the feedback line from the differential amplifier 3 to the operational amplifier 2 and shifts the photoreceiver output potential or the potential at the input of the subsequent electronics $V_a$ by $V_a=V_{a,\ preset}$.

The voltage source 5 is connected in a "floating" manner in FIG. 4, whilst in FIG. 5 it lies at earth on one side and is connected to the input of a further differential amplifier 4 with amplification 1, at whose second negative input the output signal of the different amplifier 3 lies. The output of the further differential amplifier 4 is connected to the resistance R which is connected at the positive input of the operational amplifier 2. The complete closed-loop control purpose is the same as in FIG. 4, however with the advantage with regard to circuiting technology, that the offset voltage $V_{a,\ preset}$ may be fed into the regulating circuit in a ground-referenced manner.

The voltage $V_{a,\ preset}$ may be obtained from the bipolar voltage supply of the operational amplifier 2 and of the differential amplifier 3 and 4 by way of potentiometric voltage division.

Thus, a so-called bias feeding photodiode for a photorecevier has been developed, which is schematically shown in FIG. 2. This photoreceiver comprises a terminal $V_{bias1}$ which is connected via a resistance Rbias to the cathode of a photodiode PD. The anode of the photodiode PD is connected to a signal output SIG, wherein with regard to high frequency technology, a terminal resistance $R_{50}$ is connected between the signal output SIG and earth GND. A blocking capacitance Cbias lies between the cathode of the photodiode PD and earth. The photoreceiver or the photodiode is supplied with a blocking voltage via the terminal $V_{bias1}$, and the resistance $R_{50}$ serves for reducing the RC constant for achieving higher limit frequencies and for avoiding reflections which may run from subsequently connected electronics onto the photoreceiver and degrade the signal integrity with a renewed reflection.

The new type of bias-feeding photodiode now additionally to the first bias terminal Vbias1 comprises a second bias terminal $-V_{bias2}$ and a further blocking capacitance $C_{HF}$ for the earthing of the terminal resistance with regard to RF technology. As is to be recognized from the circuit, the blocking capacitance $C_{HF}$ lies between the terminal resistance $R_{50}$ and earth GND, wherein the second bias terminal $-V_{bias2}$ is led to the outside from the connection point of both elements. The minus on the second bias terminal $-V_{bias2}$ is to indicate that a negative sequence current feed takes place at the terminal, by which means one counteracts the photocurrent with regard to potential. Usually, a positive bias voltage is to be applied to the terminal $V_{bias1}$ which may also be divided into two part terminals, and the voltage at the terminal $-V_{bias2}$ with regard to magnitude should be smaller or negative with regard to that at the terminal $V_{bias1}$. With the selection of the correct voltage amplitude at the voltage terminal $-V_{bias2}$, it is possible to set the input of the subsequent electronics, here of the demultiplexer to 0 V or also to any slight negative or positive potential if this is required by the demultiplexer.

It is therefore the object of the invention to provide a circuit arrangement for the automatic setting of an output potential $V_a$ at the RF output of a photoreceiver with a subsequently connected electronics circuit, as well as a photodiode receiver arrangement with a photodiode receiver and with such a circuit arrangement, with which it is possible in a simple manner to closed-loop control the input voltage potential $V_a$ of a circuit subsequent to the photoreceiver, such as a multiplexer, an amplifier or a sampling circuit, to a defined value, preferably 0V, wherein a direct d.c. coupling between the photoreceiver and the subsequently connected electronic circuit may be realized in a manner such that one may make do without a bias-T, and a co-packaging is possible. Moreover, an inexpensive design is to be achieved.

Due to the fact that the circuit arrangement according to the invention (see FIG. 3) comprises a control loop for producing and closed-loop controlling the voltage of a voltage supply which via the respective ohmic terminal resistance influences the output potential of the photoreceiver, and includes an ohmic replication resistance which is approximated to the ohmic terminal resistance, and further means for the measurement of the voltage difference and for reproducing the voltage difference as a voltage potential at the output terminal of the control loop, a photoreceiver as an optoelectronic integrated circuit may be connected directly in a d.c. coupled manner to an integrated subsequent electronics, for example to a multiplexer, wherein an exact control of the voltage potential $V_a$ of the output of the photoreceiver or of the input of the subsequent electronics is given, without measurement tapping being necessary at this sensitive point. Thereby, voltage of the voltage supply on the one hand with a pinTWA photoreceiver is to be understood as an operating voltage $V_{dt}$ of the associated travelling wave amplifier, whilst with a design as a pure photoreceiver with a pin-photodiode it is to be understood as the bias voltage which is applied to the second bias terminal $-V_{bias2}$. A secure starting operation of a d.c.-coupled pinTWA photoreceiver-demultiplexer combination with the help of the circuit arrangement according to the invention with a regulating (closed-loop control) control circuit, is only possible in the first place due to the fact that when booting or running up and shutting down, the output potential is automatically held at 0V and no transient overvoltage impulses may occur. Additionally, for switching on a photoreceiver with an integrated travelling wave amplifier in a secure manner, the regulating circuit stabilizes the input potential of the subsequent demultiplexer or of the subsequent electronics, also with respect to slowly changing photocurrents or optical power fluctuations at the photoreceiver input, so that one may make do without an automatic switching threshold tracking in the demultiplexer. This also applies to the embodiment example of a pure photodiode demultiplexer integration if the regulating circuit tracks the second bias terminal of the photodiode such that for quasi infinite photocurrents, the demultiplexer input potential $V_a$ is held at 0 V or to an optimal switching threshold $V_{a, preset}$.

It is further advantageous that due to the possibility of omitting a highest frequency bias-T, one may avoid appreciable high-frequency signal damping in the region of approx −6 dB and additional costs are saved. Both integrated circuits, specifically photoreceiver and subsequent electronics or demultiplexer may then be constructed in a single housing in a tightly packaged manner in co-packaging and be operated in a reliable manner.

It is particularly advantageous if the closed regulating circuit comprises a unity-gain amplifier, the replication resistance and a differential amplifier for measuring the voltage difference across the replication resistance. Thereby, the output signal of the differential amplifier with an amplification factor 1 may be led to the unity-gain amplifier as a control variable to one of its inputs, and the other input is preferably connected to the output connection of the control loop. Such a circuit has the advantage that inexpensive, integrated standard silicon switches may be used, so that the complete regulating circuit may be constructed in a simple and inexpensive manner.

The replication resistance on the one hand is preferably connected to the output of the unity-gain amplifier and on the other hand to the output connection of the control loop, so that irrespective of the magnitude of the voltage drop across the replication resistance, on account of the intrinsic negative feedback of the unity-gain amplifier, the potential provided by the differential amplifier at the one input of the unity-gain amplifier is reproduced at its second input and thus also at the output terminal of the regulating circuit, by which means the operating voltage is provided for the pinTWA and the bias voltage for the second bias terminal of the photodiode chip.

With an advantageous embodiment example, see picture 4, an additional offset voltage source is arranged within the control loop, with which the output potential at the RF output of the photoreceiver may be set to a voltage not equal to 0V, i.e. it acts in an output voltage offset shifting manner.

Advantageously, an RC low-pass is provided in the connection line between the differential amplifier and an input of the unity-gain amplifier, for limiting the closed-loop control behavior of the regulating circuit up to a defined limiting frequency.

It is particularly advantageous if the means for measuring the voltage difference and for reproducing the voltage difference as a voltage potential are connected to the output terminal of the control loop, i.e. the unity-gain amplifier and the differential amplifier are connected to a bipolar symmetrical operating voltage source, since in this manner by way of a voltage-halving circuit one may retain the supply voltage symmetry for the operation amplifier from a common main voltage supply, on booting and shutting down.

The invention claimed is:

1. A circuit for setting an output potential at a radio frequency (RF) output of a pin photoreceiver, the pin photoreceiver including an ohmic terminal resistor connected between a supply voltage and the RF output, the circuit comprising:
   a control loop including an ohmic replication resistor having a resistance approximately equal to a resistance of the ohmic terminal resistor, the control loop further including a sub-circuit configured to measure a voltage difference across the ohmic replication resistor and to reproduce the voltage difference as the supply voltage at an output terminal of the control loop.

2. The circuit of claim 1, wherein the sub-circuit comprises a unity gain amplifier, the ohmic replication resistor, and a differential amplifier, for measuring the voltage difference.

3. The circuit of claim 2, wherein the ohmic replication resistor is connected between an output of the unity gain amplifier the output terminal.

4. The circuit of claim 2, wherein the control loop comprises an RC low-pass filter connected between an output of the differential amplifier and an input of the unity gain amplifier, the RC low-pass filter configured to limit signals passed through the control loop up to a limit frequency.

5. The circuit of claim 2, wherein the differential amplifier has an amplification factor of 1.

6. The circuit of claim 1, wherein the sub-circuit comprises a first differential amplifier and a unity gain amplifier, and wherein an output of the unity-gain amplifier is connected to a first input of the first differential amplifier, a second input of the first differential amplifier is connected to the output terminal, and the ohmic replication resistor is connected between the first and second inputs of the differential amplifier.

7. The circuit of claim 6, wherein an output of the first differential amplifier is connected to a first input of the unity gain amplifier and a second input of the unity gain amplifier is connected to the output terminal of the control loop.

8. The circuit of claim 7, and further comprising an offset voltage source connected between the first input of the unity-gain amplifier and the output of the first differential amplifier.

9. The circuit of claim 8, wherein the offset voltage source is grounded on a floating potential.

10. The circuit of claim 6, wherein the sub-circuit further comprises a second differential amplifier, and wherein a first input of the second differential amplifier is connected to an offset voltage source, a second input of the second differential amplifier is connected to an output of the first differential amplifier, and an output of the second differential amplifier is connected to a second input of the unity gain amplifier.

11. The circuit of claim 10, wherein the offset voltage source is connected to ground.

12. The circuit of claim 1, wherein the sub-circuit is connected to a bipolar symmetrical operating voltage source.

13. A photoreceiver assembly comprising:
a pin photoreceiver including at least one photodiode and having a radio frequency (RF) output, the pin-photoreceiver further including an ohmic terminal resistor connected between a supply voltage and the RF output; and
a circuit including a control loop with an ohmic replication resistor having a resistance approximately equal to a resistance of the ohmic terminal resistor, the control loop further including a sub-circuit configured to measure a voltage difference across the ohmic replication resistor and to reproduce the voltage difference as the supply voltage at an output terminal of the control loop.

14. The photoreceiver assembly of claim 13, wherein the pin photoreceiver comprises a traveling wave amplifier, and wherein the output terminal is connected to the traveling wave amplifier such that the supply voltage is the positive operating voltage of the traveling wave amplifier.

15. The photoreceiver assembly of claim 13, wherein the pin photoreceiver comprises a first bias terminal configured to supply the at least one photodiode with a blocking voltage, and a second bias terminal configured to set the voltage potential at the RF output, and wherein the output terminal is connected to the second bias terminal such that the supply voltage is applied to the second bias terminal.

16. The photoreceiver assembly of claim 13, wherein the output terminal is configured for series coupling with a demultiplexer, an amplifier, or a sampling circuit.

* * * * *